United States Patent
Oota (10) Patent No.: US 7,268,490 B2
(45) Date of Patent: Sep. 11, 2007

(54) WIRING SUBSTRATE AND DISPLAY DEVICE

(75) Inventor: Masuyuki Oota, Hakusan (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/424,746

(22) Filed: Jun. 16, 2006

(65) Prior Publication Data

US 2006/0290274 A1    Dec. 28, 2006

(30) Foreign Application Priority Data

Jun. 24, 2005    (JP) .............................. 2005-185149

(51) Int. Cl.
    *H01J 1/62*    (2006.01)
(52) U.S. Cl. ...................... 313/506; 313/504; 313/509
(58) Field of Classification Search ................. 313/506
    See application file for complete search history.

(56) References Cited

U.S. PATENT DOCUMENTS 7,091,658 B2* 8/2006 Ito et al. ..................... 313/504
7,132,789 B2* 11/2006 Kobayashi .................. 313/504
7,176,621 B2* 2/2007 Do et al. ..................... 313/506
2005/0275343 A1* 12/2005 Tanaka et al. ............... 313/504

FOREIGN PATENT DOCUMENTS

JP    2003-151761    5/2003

* cited by examiner

Primary Examiner—David Bruce
Assistant Examiner—Conrad R. Blease
(74) Attorney, Agent, or Firm—Oblon, Spivak, McClelland, Maier & Neustadt, P.C.

(57) ABSTRACT

A display device includes a first insulation layer which is disposed on a support substrate with a first refractive index and has a second refractive index which differs from the first refractive index, a second insulation layer which is disposed on the first insulation layer and has a third refractive index which differs from the second refractive index, and a plurality of kinds of color pixels generate lights of different wavelengths, and have a refractive index which is substantially equal to the second refractive index. At least one kind of color pixel is put in contact with the first insulation layer via an opening portion that penetrates the second insulation layer.

10 Claims, 5 Drawing Sheets

WIRING SUBSTRATE AND DISPLAY DEVICE

CROSS-REFERENCE TO RELATED APPLICATIONS

This application is based upon and claims the benefit of priority from prior Japanese Patent Application No. 2005-185149, filed Jun. 24, 2005, the entire contents of which are incorporated herein by reference.

BACKGROUND OF THE INVENTION

1. Field of the Invention

The present invention relates generally to a display device, and more particularly to a display device which is composed of a plurality of self-luminous elements.

2. Description of the Related Art

In recent years, organic electroluminescence (EL) display devices have attracted attention as flat-panel display devices. Since the organic EL display device is a self-luminous device, it has such features as a wide viewing angle, small thickness without a need for backlight, low power consumption, and a high responsivity speed.

For these features, the organic EL display device is a promising candidate for the next-generation plat-panel display device, which will take the place of liquid crystal display devices. The organic EL display device is configured such that a plurality of organic EL elements are arranged in a matrix. Each organic EL device has such a structure that an optical active layer containing an organic compound with a light-emitting function is sandwiched between an anode and a cathode.

There has been proposed a display device of this kind, which includes a first reflection film and a second reflection film that are so arranged as to sandwich an organic EL element which generates light with a peak wavelength λ. The optical path length of the organic EL element that is sandwiched between the first reflection film and the second reflection film is set at λ·m/2 (m is an integer of 1 or more).

According to this structure, it is possible to suppress attenuation of light of a selective wavelength due to interference occurring between the first reflection film and the second reflection film (see, e.g. Jpn. Pat. Appln. KOKAI Publication No. 2003-151761).

In a typical method for realizing an organic EL display device that is capable of color display, color pixels that emit red (R), green (G) and blue (B) light are arranged. However, since the wavelengths of red (R), green (G) and blue (B) are different, different optical path lengths need to be set in the respective color pixels in order to optimize the condition of interference. In short, different film thicknesses need to be set in the respective color pixels.

However, most of thin films, which constitute the respective color pixels, are commonly used, and it is very difficult to obtain optimal optical path lengths in the respective color pixels by adjusting the film thickness of each thin film. Moreover, since the conditions for optimizing the optical path length are different between the respective color pixels of red (R), green (G) and blue (B), it is difficult to meet conditions for, e.g. both the light extraction efficiency of a given color and the color purity of another color. Thus, there is such a problem that it is difficult to achieve both the increase in luminance and the increase in color purity.

BRIEF SUMMARY OF THE INVENTION

The present invention has been made in consideration of the above-described problem, and the object of the invention is to provide a display device with a good display quality.

According to an aspect of the present invention, there is provided a display device comprising: a first insulation layer which is disposed on a substrate with a first refractive index and has a second refractive index which differs from the first refractive index; a second insulation layer which is disposed on the first insulation layer and has a third refractive index which differs from the second refractive index; and a plurality of kinds of display elements generate lights of different wavelengths, and have a refractive index which is substantially equal to the second refractive index, wherein at least one kind of display element is put in contact with the first insulation layer via an opening portion that penetrates the second insulation layer.

The present invention can provide a display device with a good display quality.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A display device according to an embodiment of the present invention will now be described with reference to the accompanying drawings. In the embodiment, a self-luminous display device, for instance, an organic EL (electroluminescence) display device, is exemplified as the display device.

Figure 1:
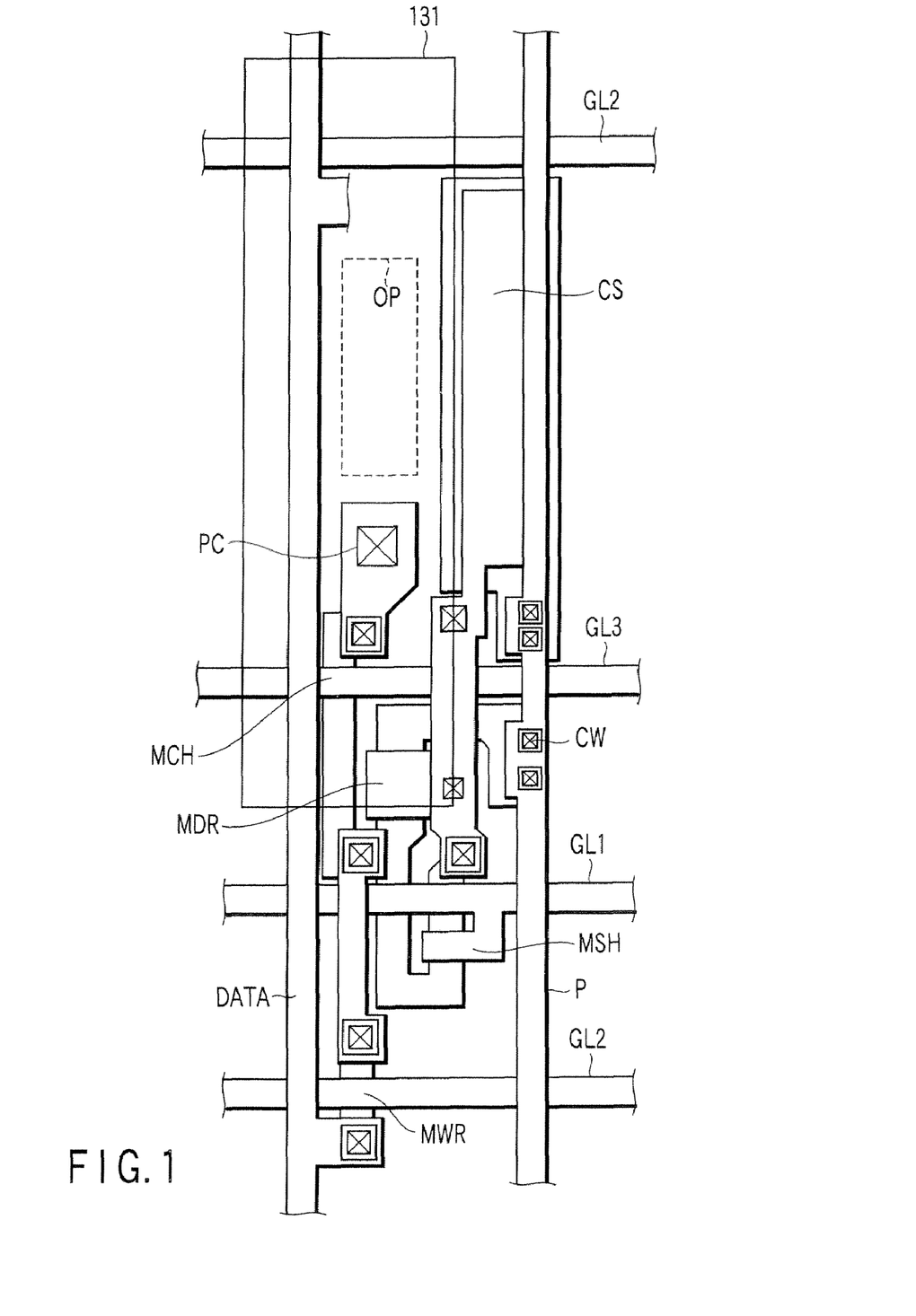
FIG. 1 is a plan view showing an example of layout of the pixel configuration of an organic EL display device according to an embodiment of the present invention.

As is shown in FIG. 1, in the organic EL display device according to the embodiment, a unit pixel is composed of at least four transistors and one organic EL (OLED) element that is a self-luminous display element. In the layout shown in FIG. 1, the pixel circuit is constructed as follows. By setting a first scan line GL1 in an active state, a second transistor MSH is turned on so as to short-circuit the gate and drain of a first transistor MDR, and a video signal current with a value corresponding to a video signal is caused to flow through the first transistor MDR and a third transistor MWR. Then, the first scan line GL1 is set in an inactive state, and the second transistor MSH and third transistor MWR are turned off. Thus, a gate-source voltage of the first transistor MDR, which corresponds to the video signal current, is stored in a capacitor CS which is connected between the gate and source of the first transistor MDR. Subsequently, a third scan line GL3 is set in an active state and the video signal current is let to flow to the OLED element via a fourth transistor MCH.

This pixel circuit is described in greater detail. Specifically, the source of the first transistor MDR is connected to an anode power supply (voltage supply) P via a contact hole CW. The gate of the first transistor MDR is connected to the source of the second transistor MSH. The gate of the second transistor MSH is connected to the first scan line GL1. The drain of the second transistor MSH is connected to the drain of the first transistor MDR, the source of the third transistor MWR and the source of the fourth transistor MCH. The drain of the third transistor MWR is connected to a signal line DATA. The gate of the third transistor MWR is connected to a second scan line GL2. The gate of the fourth transistor MCH is connected to the third scan line GL3. The drain of the fourth transistor MCH is connected to an anode 131, which is a structural component of the OLED element, via a contract hole PC.

All of these transistors may be P-channel transistors or N-channel transistors, or may be transistors of different conductivity types. In the present embodiment, all of these transistors are P-channel transistors. In addition, in this embodiment, low-temperature polysilicon thin-film transistors (TFT) are applied to these transistors. However, the transistors which constitute the above-described pixel circuit are not limited to low-temperature polysilicon thin-film transistors. Single-crystal transistors on a silicon wafer are applicable. In addition, high-temperature polysilicon transistors which are formed on a quartz substrate, continuous grain silicon (CGS) transistors, or amorphous silicon transistors, are applicable.

The transistors, which are applied to the embodiment, are TFTs each having a top-gate planar-type cross-sectional structure. Alternatively, these transistors may be of a bottom-gate type, a stagger type or an inverse-stagger type. Further, these transistors may have impurity regions (source, drain) which are formed by a self-alignment method or a non-self-alignment method.

Besides, in the present embodiment, the pixel circuit comprises four transistors, but the number of transistors is not limited. All of these structures are within the scope of the invention.

The signal line DATA is a wiring line for supplying a video signal current. The first scan line GL1, second scan line GL2 and third scan line GL3 are wiring lines for supplying control signals for setting the transistors of each pixel in an active/inactive state. The power supply line P is a wiring line for supplying an anode voltage to the OLED element. Preferably, each wiring line should have a low resistance. Each wiring line is formed of a single layer or a stack of two or more layers of a metallic material containing at least one of aluminum (Al), titanium (Ti) or titanium nitride (TiN), tantalum (Ta), molybdenum (Mo), chromium (Cr), tungsten (W), copper (Cu), neodymium (Nd), and zirconium (Zr). However, in this invention, the material of each wiring line is not limited to these.

The capacitor CS, which stores a gate-source voltage of the first transistor MDR, is substantially formed on a non-display region between neighboring pixels. In a case where a display panel of a color display type is formed of an OLED element using a low-molecular-weight material, an optical active layer of the OLED element is formed by mask evaporation deposition using a metal mask. Thus, the width of the non-display region between neighboring pixels becomes about 10 to 20 μm. This region does not contribute to light emission. Thus, to form the capacitor CS in this region is an effective means for enhancing the aperture ratio in the case of a back-surface emission system in which light is extracted from that side of a support substrate (e.g. glass substrate) on which transistors are formed.

Next, the structure of the OLED element is described.

Figure 2:
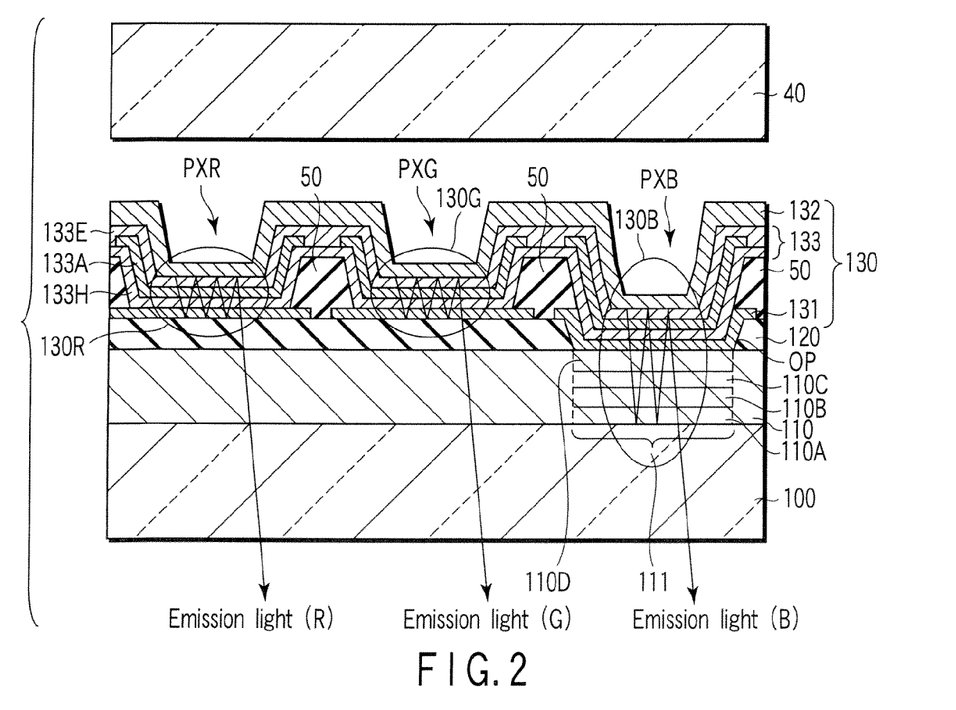
FIG. 2 is a cross-sectional view that schematically shows a pixel configuration according to the embodiment of the invention.

FIG. 2 shows an example of the structure of the organic EL display device according to the embodiment. In this embodiment, the back-surface emission system is adopted. Specifically, an insulating member with a relatively low refractive index (first refractive index; n=1.4 to 1.6), for instance, a glass substrate, is used as a support substrate 100. A transistor array 110 of a desired shape is disposed on the support substrate 100. The transistor array 110 includes, on the support substrate 100, an undercoat film formed of silicon nitride (SiN) and silicon oxide (SiO), a polysilicon film, a gate electrode, a gate insulation film, a source electrode, a drain electrode, an interlayer insulation film for insulating these electrodes, and a protection film for protecting these components. The gate insulation film, the interlayer insulation film and the protection film are, like the undercoat film, formed of an inorganic material with a relatively high refractive index (second refractive index; n=1.8 to 2.2), for instance, silicon nitride (SiN) and silicon oxide (SiO).

A planarization film 120 is disposed on the transistor array 110. A contact hole for electrically connecting the anode of the OLED element and the transistors of the transistor array 110 is provided in the planarization film 120. The planarization film 120 is formed of an insulating material with a relatively low refractive index (third refractive index; n=1.3 to 1.7), such as a resin-based coating film of photoresist, polyimide or acrylic resin. Preferably, an organic film, which can realize high thickness and high planarity, should be applied to the planarization film 120.

An OLED element 130 is disposed on the planarization film 120. In the present embodiment, the OLED element 130 includes a first electrode with light transmissivity (e.g. a hole injection electrode functioning as an anode) 131, at least one kind of optical active layer 133, and a second electrode (e.g.

an electron injection electrode functioning as a cathode) 132. The first electrode 131 is formed in an insular shape in each pixel. The second electrode 132 is disposed to be opposed to the first electrode 131. The optical active layer 133 is held between the first electrode 131 and second electrode 132.

The optical active layer 133 includes at least one hole transport layer and a light-emitting layer 133A. For example, the optical active layer 133 includes a hole injection layer, a hole transport layer, a light-emitting layer 133A, an electron transport layer and an electron injection layer, which are stacked in the named order. The optical active layer 133 of the OLED element 130 in this invention may have various structures. For example, the electron injection layer and electron transport layer may be dispensed with, or may be formed integral with the light-emitting layer, or the hole injection/transport layer and light-emitting layer may be combined. In the optical active layer 133, the layers other than the light-emitting layer 133A are common layers. In the example shown in FIG. 2, a hole-side common layer 133H, which is disposed on the first electrode 131 side, includes the hole injection layer and the hole transport layer. An electron-side common layer 133E, which is disposed on the second electrode 132 side, includes the electron transport layer and electron injection layer. The light-emitting layer 133A is disposed between the hole-side common layer 133H and electron-side common layer 133E.

In the structure adopting the back-surface emission system, the first electrode 131 is formed of a light-transmissive, electrically conductive material such as ITO (indium thin oxide), IZO (indium zinc oxide), ZnO (zinc oxide), $SnO_2$ (tin oxide) or $In_2O_3$ (indium oxide). In particular, it is preferable to form the first electrode 131 of ITO or IZO. The first electrode 131 should have a predetermined thickness or more, which is sufficient for hole injection. Although the first electrode 131 can be formed by evaporation deposition, it is preferable to form it by sputtering. The kind of sputtering gas is not limited. For example, an inert gas such as argon (Ar), helium (He), neon (Ne), krypton (Kr) or xenon (Xe), or a mixture gas thereof is applicable. The first electrode 131, which is thus formed, has a relatively high refractive index (n=1.8 to 2.2).

The second electrode 132 is formed of a metal, a metal compound or an alloy, which has a low work function and is formed by evaporation deposition, sputtering, etc., preferably by evaporation deposition. In the structure adopting the back-surface emission system, the second electrode 132 is formed of a light-transmissive, electrically conductive material. Preferably, the second electrode 132 should be formed of a metal elemental substance such as potassium (K), lithium (Li), sodium (Na), magnesium (Mg), lanthanum (La), cerium (Ce), calcium (Ca), strontium (Sr), barium (Ba), aluminum (Al), silver (Ag), indium (In), tin (Sn), zinc (Zn) or zirconium (Zr), or should be formed of a two-component or three-component alloy system including these metals in order to improve stability. Preferable alloy materials include Ag·Mg (Ag: 1 to 20 at %), Al·Li (Li: 0.3 to 14 at %), In·Mg (Mg: 50 to 80 at %), and Al·Ca (Ca: 5 to 20 at %). The second electrode 132 should have a predetermined thickness or more, which is sufficient for electron injection.

In the hole-side common layer 133H, the hole injection layer has a function of facilitating injection of holes from the first electrode 131, and the hole transport layer has a function of transporting holes and a function of hindering electrons.

In the electron-side common layer 133E, the electron injection layer and electron transport layer are provided when the electron injection function and electron transport function of the compound that is used for the light-emitting layer 133A are not sufficiently high. The electron injection layer and electron transport layer have a function of facilitating injection of electrons from the second electrode 132, a function of transporting electrons and a function of hindering holes. The hole injection layer, hole transport layer, electron injection layer and electron transport layer increase and confine holes and electrons which are injected in the light-emitting layer 133A, optimize a region for recombination, and improve the light emission efficiency. The electron-side common layer 133E may separately include a layer having an electron injection function and a layer having an electron transport function, or may be a functionally integrated layer.

The light-emitting layer 133A of the OLED element 130 in the present invention contains a fluorescent substance which is a compound having a light-emitting function. Examples of the fluorescent substance include a metal complex dye such as tris (8-quinolinolato) aluminum [Alq3], as disclosed in Jpn. Pat. Appln. KOKAI Publication No. 63-264692; Jpn. Pat. Appln. KOKAI Publication No. 6-110569 (phenylanthracene derivative); Jpn. Pat. Appln. KOKAI Publication No. 6-114456 (tetraarylethane derivative); and blue/green light emitting materials as disclosed in Jpn. Pat. Appln. KOKAI Publication No. 6-100857 and Jpn. Pat. Appln. KOKAI Publication No. 2-247278. The light-emitting layer 133A, which is thus formed, has a relatively high refractive index (n=1.8 to 2.2).

The hole injection layer and hole transport layer, which constitute the hole-side common layer 133H, may be formed of various organic compounds as disclosed, for instance, in Jpn. Pat. Appln. KOKAI Publications Nos. 63-295695, 2-191694, 3-792, 5-234681, 5-239455, 5-299174, 7-126225, 7-126226, and 8-100172, and EP0650955A1. The hole-side common layer 133H, which is thus formed, has a relatively high refractive index (n=1.8 to 2.2). Similarly, the electron-side common layer 133E has a relatively high refractive index (n=1.8 to 2.2). As described above, each of the thin films of the OLED element 130 is formed of a material with a refractive index which is higher than the first refractive index and the third refractive index, and the refractive index of each of these thin films is substantially equal to the second refractive index.

It is preferable to form the hole injection layer, hole transport layer, light-emitting layer, electron injection layer and electron transport layer by a vacuum evaporation method, since uniform thin films can be formed by this method.

The organic EL display device is sealed with a seal material 40 in order to prevent moisture from entering the optical active layer 133. In the present embodiment, the seal material 40 is configured such that glass plates are attached by a sealing member, and the space between the glass plates is demoistured by a desiccating agent. In other applicable methods, the sealing may be effected by a stacked structure of a metal thin film and an organic film, or the sealing may be effected by a metal cap. All of these techniques are within the scope of the invention.

In proposed methods for coloring, for example, an OLED element, which emits white light, may be combined with red, green and blue color filters, or an OLED element, which emits blue light, may be combined with wavelength conversion layers. In the present embodiment, a plurality of kinds of light-emitting materials, which have light-emission peaks at different wavelengths (e.g. blue wavelength, green wavelength and red wavelength), are individually coated.

Specifically, the organic EL display device according to the present embodiment includes a plurality of kinds of display elements. A red OLED element 130R which mainly emits light of a red wavelength is disposed in a red pixel PXR. Similarly, a green OLED element 130G which mainly emits light of a green wavelength is disposed in a green pixel PXG. A blue OLED element 130B which mainly emits light of a blue wavelength is disposed in a blue pixel PXB. These color pixels PX (R, G, B) are partitioned by lattice-shaped or stripe-shaped partition walls 50.

As described above, the planarization film 120 is disposed between the transistor array 110 and each OLED element 130 (exactly speaking, between the transistor array 110 and the first electrode 131) in order to prevent short-circuit of the OLED element 130 due to unevenness of the transistor array 110.

The refractive index n of the planarization film 120 is about 1.3 to 1.7 and is low, while the refractive index n of each of the thin films, which constitute the first electrode 131 and optical active layer 133 that are formed of ITO, is about 1.8 to 2.2 and is high. Consequently, part of the light that is generated by the optical active layer 133 is reflected by the interface between the first electrode 131 and planarization film 120, and the light interferes in the optical path between the interface and the second electrode 132 that is the reflective electrode. This interference effect greatly influences the light extraction efficiency and color purity.

Figure 3:
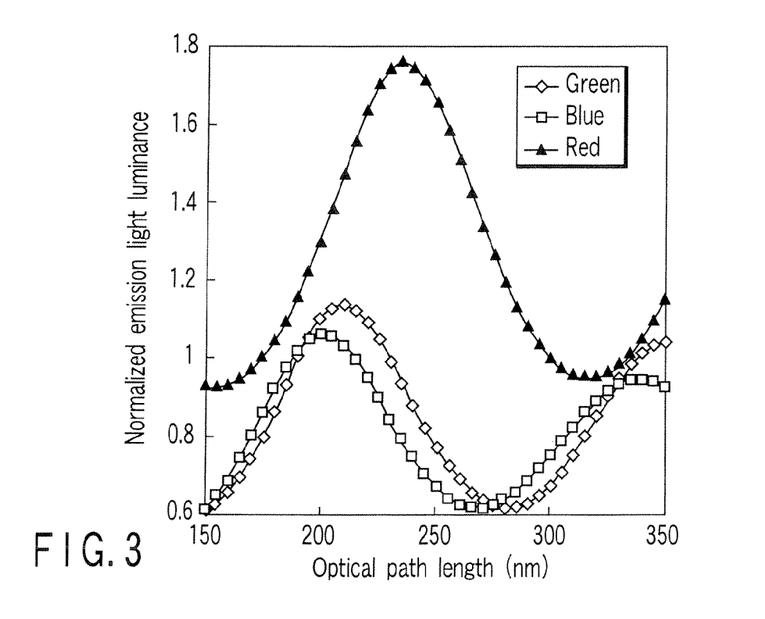
FIG. 3 is a graph showing an example of the relationship between a substantial optical path length and a normalized emission light luminance in each color pixel.

FIG. 3 shows an example of the relationship between a substantial optical path length and a normalized emission light luminance in each color pixel PX (R, G, B). As in the example shown in FIG. 3, the optical path length, at which the emission light luminance takes a maximum value, is not necessarily equal (or substantially equal) between the color pixels PX (R, G, B). In the example of FIG. 3, the optical path length, at which the emission light luminance takes a maximum value, is about 230 nm with respect to the red pixel PXR, about 200 nm with respect to the blue pixel PXB, and about 220 nm with respect to the green pixel PXG. In short, in order to optimize the condition of interference in each pixel and to obtain a maximum emission light luminance, it is necessary to set an optimal optical path length on a color pixel by color pixel basis.

Figure 4A:
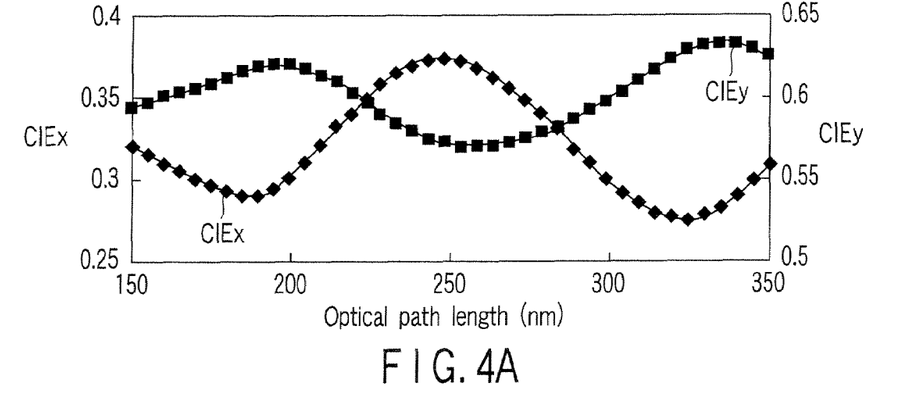
FIG. 4A is a graph showing an example of the relationship between a substantial optical path length and coordinate values (CIEx and CIEy) on a chromaticity diagram of light which is emitted by a green pixel.
Figure 4B:
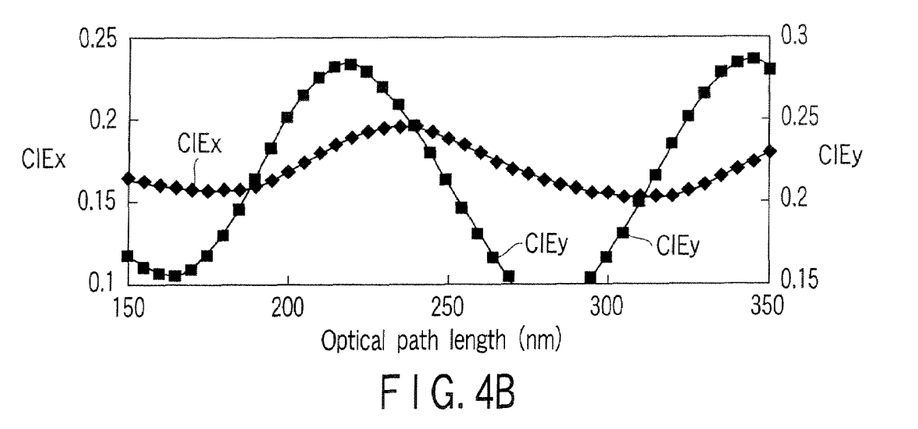
FIG. 4B is a graph showing an example of the relationship between a substantial optical path length and coordinate values (CIEx and CIEy) on a chromaticity diagram of light which is emitted by a blue pixel.
Figure 4C:
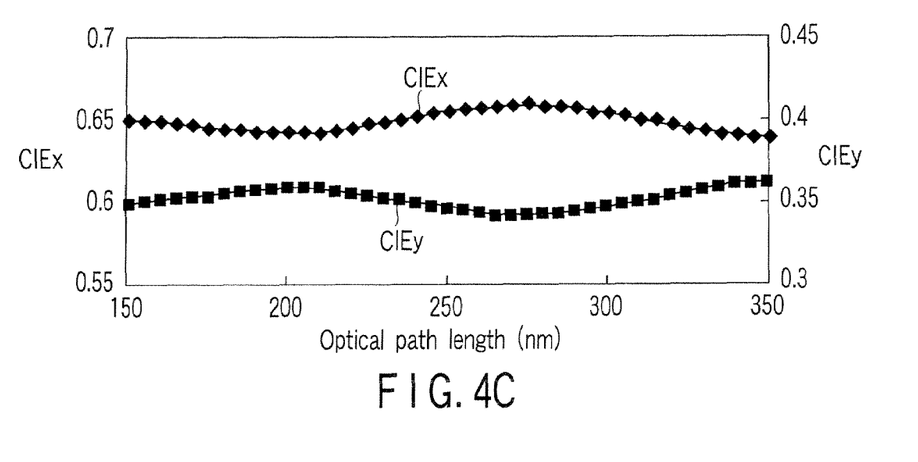
FIG. 4C is a graph showing an example of the relationship between a substantial optical path length and coordinate values (CIEx and CIEy) on a chromaticity diagram of light which is emitted by a red pixel.

On the other hand, as regards the color purity, FIG. 4A shows an example of the relationship between a substantial optical path length and coordinate values (CIEx and CIEy) on a chromaticity diagram of light which is emitted by the green pixel PXG, FIG. 4B shows an example of the relationship between a substantial optical path length and coordinate values (CIEx and CIEy) on a chromaticity diagram of light which is emitted by the blue pixel PXB, and FIG. 4C shows an example of the relationship between a substantial optical path length and coordinate values (CIEx and CIEy) on a chromaticity diagram of light which is emitted by the red pixel PXR.

As regards green light, the color purity is higher (i.e. denser) as the value of the CIEy on the chromaticity diagram substantially increases. As regards blue light, the color purity is higher (i.e. denser) as the value of the CIEy on the chromaticity diagram substantially decreases. As regards red light, the color purity is higher (i.e. denser) as the value of the CIEx on the chromaticity diagram substantially increases.

As in example shown in FIG. 4A to 4C, the optical path length, at which the color purity takes a maximum value, is not necessarily equal (or substantially equal) between the color pixels PX (R, G, B). In the case of the blue pixel PXB, the color purity greatly varies relative to the optical path length. In the case of the red pixel PXR, the color purity does not greatly vary relative to the optical path length. For example, as regards the blue pixel PXB, as shown in FIG. 4B, the optical path length at which the color purity takes a maximum value is about 270 nm. In short, in order to obtain the optimal chromaticity by optimizing the condition of interference in each color pixel, it is necessary to set an optimal optical path length on a color pixel by color pixel basis.

In the case where the OLED element 130 is disposed on the planarization film 120, the optical path length in FIG. 3 and FIGS. 4A to 4C substantially corresponds to the thickness of the first electrode 13 and optical active layer 133. In order to optimize the condition of interference in each color pixel, it is thus desirable to set different film thicknesses in the respective pixels.

However, as described above, the layers, other than the light-emitting layer 133A, are common layers, and it is difficult to greatly vary the film thickness of the light-emitting layer 133A since this thickness influences the carrier balance. For example, assume that as regards the red pixel PXR the film thickness is set at about 230 nm by selecting the condition under which the emission light luminance takes a maximum value, that as regards the blue pixel PXB the film thickness is set at about 270 nm by selecting the condition under which the chromaticity takes an optimal value, and that as regards the green pixel PXG the film thickness is set at about 220 nm by selecting the condition under which the emission light luminance takes a maximum value. In this case, however, there is a difference of 50 nm in film thickness at maximum. It is difficult to obtain such a large difference in film thickness simply by adjusting the thickness of the light-emitting layer 133A. It is thus very difficult to satisfy, at the same time, the conditions (for optimal emission light luminance or chromaticity) that are selected for the respective color pixels.

As regards the green light, the relationship between the optical path length and the emission light luminance, as in the example of FIG. 3, substantially agrees with the relationship between the optical path length and the chromaticity (CIEy), as in the example of FIG. 4A. Thus, by optimizing the interference effect (i.e. by selecting the optical path length of the optimal condition), both the emission light luminance and the chromaticity can be improved at the same time. In short, green light has a high contribution to the luminance of white. Therefore, if the optical path length which meets the condition for improving the emission light luminance is selected, the chromaticity, as a result, is improved.

By contrast, as regards the blue light, the relationship between the optical path length and the emission light luminance, as in the example of FIG. 3, is contradictory to the relationship between the optical path length and the chromaticity (CIEy), as in the example of FIG. 4B. In other words, there is a trade-off between the optimizing condition for improving the emission light luminance and the optimizing condition for improving the chromaticity. As regards the blue light, the absence of a variation in emission light luminance and chromaticity due to the interference effect is preferable to the optimization of the interference effect.

In the present embodiment, as shown in FIG. 1 and FIG. 2, the blue pixel PXB is put in contact with the transistor array 110 via an opening portion OP that penetrates the planarization film 120. Specifically, the protection film, interlayer insulation film, gate insulation film and undercoat film of the transistor array 110 are formed of silicon nitride (SiN). These films have a refractive index (1.8 to 2.2) that is substantially equal to the refractive index of the ITO of the first electrode 131 of the OLED element 130 and the organic material of the optical active layer 133, and the total film thickness thereof is 500 nm to 1500 nm and is large.

Since the purpose of the provision of the planarization film 120 is to prevent short-circuit of the OLED element 130 due to the unevenness of the transistor array 110, the opening portion OP, which penetrates the planarization film 120, is formed in a relatively flat portion of the transistor array 110, which does not overlap the polysilicon film, various electrodes or various wiring lines. Specifically, that part of the transistor array 110, which is exposed by the opening portion OP, corresponds to a first insulation layer or surface layer 111 of the substrate, on which the light-transmissive insulation films with a substantially equal refractive index, such as the undercoat film 110A, gate insulation film 110B, interlayer insulation film 110C and protection film 110D, are stacked.

The blue pixel PXB directly contacts the first insulation layer 111. Specifically, the first electrode 131 of the OLED element 130 for the blue pixel PXB corresponds to a substrate-side layer of the display element. The first electrode 131 contacts the first insulation layer 111 with a refractive index substantially equal to the refractive index of the first electrode 131. The red pixel PXR and green pixel PXG are disposed on the planarization film 120 which is stacked on the first insulation layer 111. The planarization film 120 corresponds to an insulation layer or a second insulation layer.

Assume now that the refractive index of the surface layer (e.g. first insulation layer 111) of the substrate is n1, the refractive index of the insulation layer (e.g. planarization film 120) is n2 and the refractive index of the substrate-side layer (e.g. first electrode 131) of the display element is n3. Since n1 and n3 are substantially equal, a difference therebetween is small, and n2 is lower than n1 and n3. Thus, the following relationship is established:

$$|n1-n3|<|n2-n3|.$$

Accordingly, as regards the blue pixel PXB, no reflection occurs at the interface between the first electrode 131 and the first insulation layer 111. The optical path length of the condition of interference is 600 nm to 1800 nm and is much greater than 100 nm to 400 nm in the case of the red pixel PXR and green pixel PXG which are provided via the planarization film 120. Thereby, the blue light with a shortest wavelength becomes less susceptible to the interference effect, and is hardly affected by a variation in emission light luminance or chromaticity due to the film thickness (substantial optical path length) of the OLED element 130.

Figure 5:
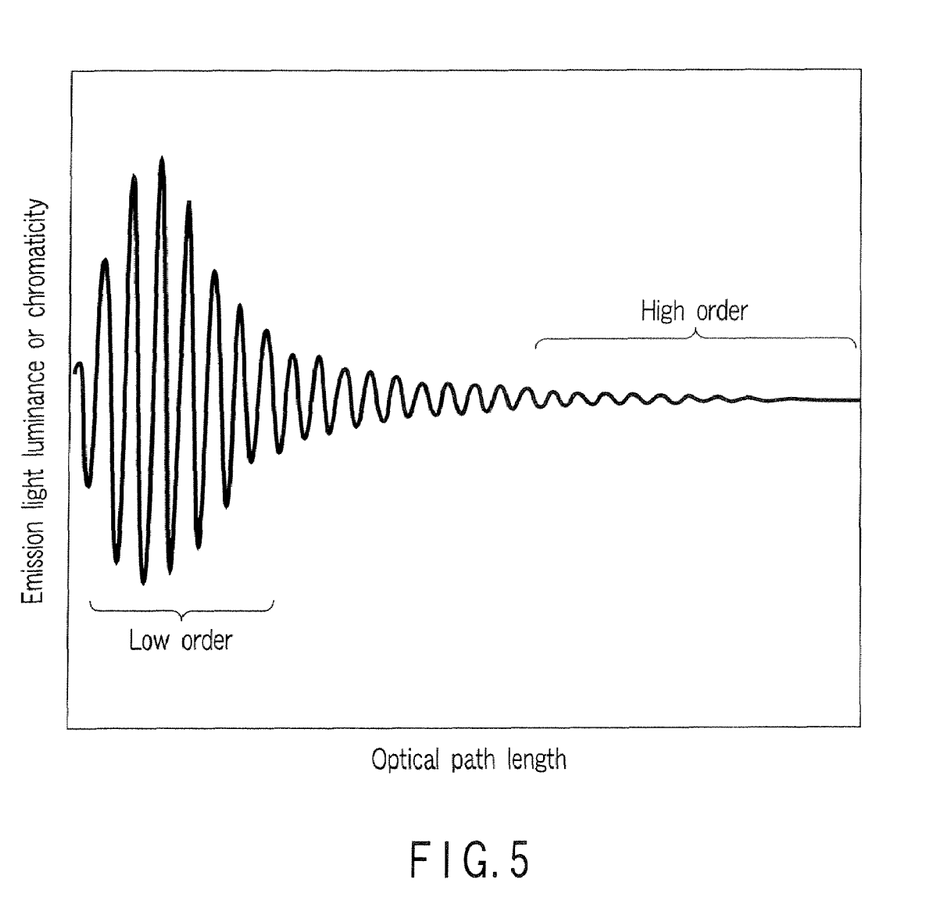
FIG. 5 is a graph for explaining the tendency of the interference condition of emission light luminance or chromaticity in relation to the optical path length.

To be more specific, in the present invention, attention has been paid to the fact that the variation in emission light luminance or chromaticity due to the interference effect decreases as the optical path length becomes greater. Under a low-order interference condition as shown in FIG. 3 and FIGS. 4A to 4C, the variation in emission light luminance and chromaticity, relative to the optical path length, is very large. By contrast, under a high-order interference condition, as shown in FIG. 5, the variation in emission light luminance and chromaticity, relative to the optical path length, decreases (this phenomenon exhibits a similar tendency with respect to not only blue light but also other color light). Thus, in the present embodiment, as regards blue light for which there is a trade-off between the optimizing condition for improving the emission light luminance and the optimizing condition for improving the chromaticity, the high-order interference condition is utilized, and the condition under which there is no substantial variation in emission light luminance and chromaticity (the condition under which the optical path length is sufficiently great, that is, the film thickness is sufficiently great) is selected. By choosing this structure, sufficient emission light luminance and chromaticity can be obtained at the same time with respect to the blue pixel PXB.

On the other hand, the interference condition of the hole-side common layer 133H and electron-side common layer 133E of the OLED element 130 should be optimized with respect to only the two pixels, that is, the green pixel PXG and red pixel PXR. In either case, the optimal condition is satisfied by selecting the optical path length (film thickness) in the vicinity of 220 to 230 nm. Such a small difference in film thickness can sufficiently be adjusted by only the film thickness of the light-emitting layer 133A. Thus, in the present embodiment, the thickness of the OLED element 130 excluding the second electrode 132 (i.e. the sum of the thickness of the optical active layer 133 and the thickness of the first electrode 131) is set at 220 nm in the green pixel PXG and at 230 nm in the red pixel PXR. Thereby, the maximum emission light luminance can be obtained with respect to the green pixel PXG and red pixel PXR, and the optimal chromaticity can also be obtained with respect to the green pixel PXG.

In the present embodiment, as regards the blue pixel PXB, the OLED element 130 is put in direct contact with the first insulation layer 111, which has substantially the same refractive index as the thin films of the OLED element 130, via the opening portion OP that is formed in the planarization film 120 (exactly speaking, the OLED element 130 is put in contact with the protection film 110D of the transistor array 110, which is positioned most on the OLED element 130 side). Thereby, the blue pixel PXB is less affected by the interference effect, and the optical path length (film thickness) can be set for the green pixel PXG and red pixel PXR under the condition for obtaining necessary characteristics (e.g. maximum luminance). As a result, the organic EL display device having a high display quality with high luminance and high color reproducibility was obtained. In addition, the viewing-angle dependency of the chromaticity due to the interference effect of the blue pixel PXB was eliminated (i.e. the occurrence of a chromaticity difference due to the difference in optical path length, which results from a difference in viewing angle, was suppressed). As regards the characteristics of the material of the planarization film 120, there is a case in which the absorption rate of light with a specific wavelength is high. In the planarization film 120 that is applied to the present embodiment, the absorption rate of light of blue wavelength is particularly high. Thus, as regards the blue pixel PXB, the OLED element 130 is put in direct contact with the first insulation layer 111 via the opening portion OP that is formed in the planarization film 120. Thereby, blue emission light from the OLED element 130 is not absorbed by the planarization film 120, and the extraction efficiency of blue light, which is extracted to the outside, can be improved.

The above-described planarization film 120 is formed of, e.g. a positive type resin material. Specifically, a resin material is formed on the first insulation layer 111. Subsequently, using a photomask having an opening pattern corresponding to the blue pixel PXB, the resin material is exposed and then developed. Thereby, the planarization film 120 having the opening portion corresponding to the blue pixel PXB is formed. Thereafter, the first electrode 131, optical active layer 133 and second electrode 132 are successively formed. Thus, the blue OLED element that contacts the first insulation layer 111 and the red OLED element and green OLED element 130, which are disposed on the planarization film 120, are formed.

In the case where the planarization film 120 is formed using a negative type resin material, the resin material is exposed via a photomask having a light-blocking pattern corresponding to the blue pixel PXB, and then the resin material is developed. Thereby, the planarization film 120 having the similar opening portion OP can be formed.

Next, other embodiments of the invention will be described. In the above-described embodiment, one kind of OLED element 130B, which is included in the organic EL display device, is disposed in contact with the first insulation layer 111, which is the surface layer of the substrate, without intervention of the planarization film 120. Two kinds of OLED elements 130R and 130G are disposed in contact with the planarization film 120.

Figure 6:
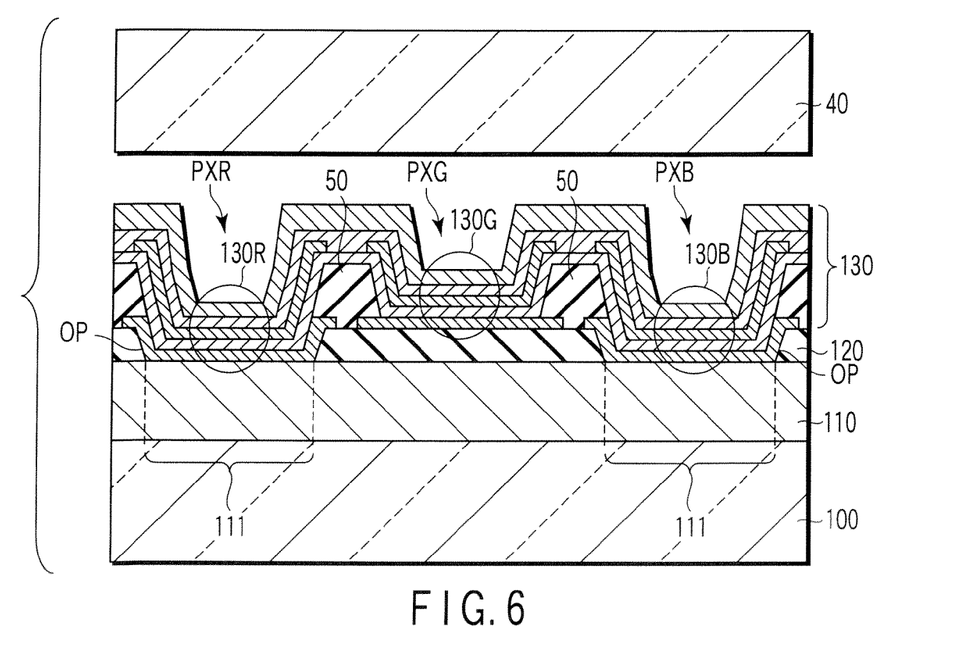
FIG. 6 is a cross-sectional view that schematically shows a pixel configuration according to another embodiment of the invention.

In another embodiment of the invention, as shown in FIG. 6, the red pixel PXR, like the blue pixel PXB, is put in contact with the transistor array 110 via an opening portion OP that penetrates the planarization film 120. Specifically, two kinds of OLED elements 130R and 130B, which are included in the organic EL display device, are disposed in contact with the first insulation layer 111, which is the surface layer of the substrate, without intervention of the planarization film 120. One kind of OLED element G is disposed in contact with the planarization film 120.

Thereby, the optimal film thickness of the OLED element 130 can be optimized by only the green pixel PXG that has high contribution to the luminance of white. Hence, the matching of the interference condition with the red pixel was made needless, and not only the film thickness in the vicinity of 200 nm but also the film thickness in the vicinity of 350 nm could be selected. Thus, the whole film thickness was increased, and the occurrence of short-circuit defect (black point) due to entrance of foreign matter in the OLED element 130 could be suppressed.

Figure 7:
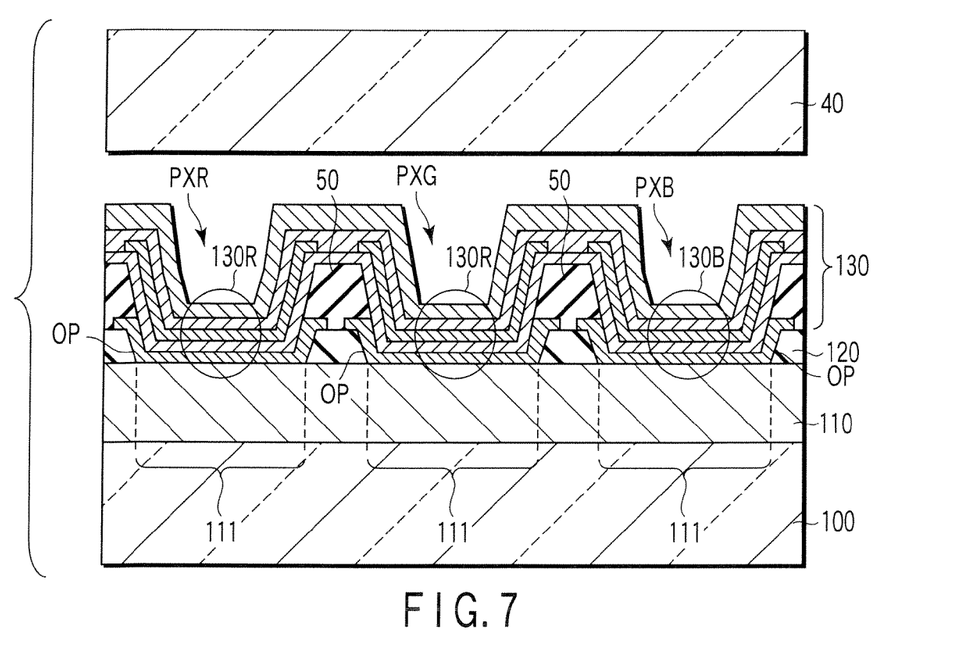
FIG. 7 is a cross-sectional view that schematically shows a pixel configuration according to still another embodiment of the invention.

In still another embodiment of the invention, as shown in FIG. 7, the red pixel PXR and green pixel PXG, like the blue pixel PXB, are put in contact with the transistor array 110 via opening portions OP that penetrate the planarization film 120. Specifically, all kinds of OLED elements 130 (R, G, B), which are included in the organic EL display device, are disposed in contact with the first insulation layer 111, which is the surface layer of the substrate, without intervention of the planarization film 120.

Thereby, the matching of the interference condition with respect to all the color pixels is needless. In addition, like the embodiment shown in FIG. 6, the whole film thickness could be increased, and the occurrence of short-circuit defect (black point) due to entrance of foreign matter in the OLED element 130 could be suppressed. Moreover, the OLED element 130 of each color pixel is hardly affected by moisture remaining in the planarization film 120, and deterioration in lifetime can be suppressed. Besides, even if non-uniformity occurs in the thickness of the planarization film 120, a variation in characteristics can be suppressed.

As has been described above, taking into account the light emission wavelengths of the plural kinds of color pixels that are used for color display, the substantial optical path length, at which the emission light luminance and chromaticity become optimal, is not necessarily equal between the color pixels. It is thus necessary to set the optical path length, that is, the film thickness under the condition for obtaining necessary characteristics for each color pixel. Thus, the high-order interference condition, which is less affected by the optical path length, is applied to at least one kind of OLED element, that is, the color pixel whose optical path length of the optimal condition sharply differs from the optical path length of the optimal condition of other colors, or to the color pixel in which there is a trade-off between the optimizing conditions for improving two or more necessary characteristics (e.g. emission light luminance and chromaticity). In order to make use of the high-order interference condition, it should suffice if the optical path length is increased. For this purpose, the OLED element is put in contact with the insulation layer having a refractive index which is substantially equal to the refractive index of the OLED element, and the substantial optical path length is increased. Thereby, as regards the color pixel whose optical path length is increased, necessary characteristics can be obtained without influence of the optical path length. In the above-described embodiments, the OLED element for the blue pixel is put in contact with the insulation layer having a refractive index which is substantially equal to the refractive index of this OLED element. However, the invention is not limited to this example. The same structure is applicable to another color pixel, and is also applicable to two or more kinds of color pixels.

The present invention is not limited to the above-described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

What is claimed is:

1. A display device comprising:
    a first insulation layer which is disposed on a substrate with a first refractive index and has a second refractive index which differs from the first refractive index;
    a second insulation layer which is disposed on the first insulation layer and has a third refractive index which differs from the second refractive index; and
    a plurality of kinds of display elements generate lights of different wavelengths, and have a refractive index which is substantially equal to the second refractive index,
    wherein at least one kind of display element is put in contact with the first insulation layer via an opening portion that penetrates the second insulation layer.

2. The display device according to claim 1, wherein the display element, which is put in contact with the first insulation layer, generates light of a blue wavelength.

3. The display device according to claim 1, wherein the second refractive index is higher than the first refractive index and the third refractive index.

4. The display device according to claim 1, wherein the first insulation layer is formed of multiple layers including a silicon nitride film.

5. The display device according to claim 1, wherein the display element includes a first electrode which is formed in an insular shape and has light transmissivity, a second electrode which is disposed to be opposed to the first electrode, and an optical active layer which is held between the first electrode and the second electrode.

6. The display device according to claim 1, wherein the display device includes a plurality of thin-film transistors which are formed on the substrate.

7. A display device comprising:
a substrate having a surface layer;
an insulation layer which is disposed in contact with the surface layer of the substrate; and
a plurality of kinds of display elements which are disposed on the substrate and generate lights of different wavelengths, wherein a relationship, $$|n1-n3|<|n2-n3|$$

is established, where n1 is a refractive index of the surface layer of the substrate, n2 is a refractive index of the insulation layer, and n3 is a refractive index of a layer of the display element, which is located on the substrate side, and
at least one kind of display element is disposed in contact with the surface layer of the substrate.

8. The display device according to claim 7, wherein a first display element which generates light of a first wavelength is disposed in contact with the insulation layer, and
a second display element, which generates light of a second wavelength that is different from the first wavelength, is disposed in contact with the surface layer of the substrate without intervention of the insulation film.

9. The display device according to claim 7, wherein a first display element, which generates light of a first wavelength, and a second display element, which generates light of a second wavelength that is different from the first wavelength, are disposed in contact with the surface layer of the substrate without intervention of the insulation film.

10. A display device comprising:
a substrate having a surface layer;
an insulation layer which is disposed in contact with the surface layer of the substrate; and
a display element which is disposed on the substrate and generates light,
wherein a relationship, $$|n1-n3|<|n2-n3|$$

is established, where n1 is a refractive index of the surface layer of the substrate, n2 is a refractive index of the insulation layer, and n3 is a refractive index of a layer of the display element, which is located on the substrate side, and
the display element is disposed in contact with the surface layer of the substrate without intervention of the insulation film.

* * * * *